United States Patent [19]
Petersen

[11] Patent Number: 6,078,169
[45] Date of Patent: Jun. 20, 2000

[54] AMPLIFIER FOR INTERPOLATING THE POWER SUPPLY FROM MULTIPLE SUPPLY VOLTAGES

[75] Inventor: David A. Petersen, Fall City, Wash.

[73] Assignee: Siemens Medical Systems, Inc., Iselin, N.J.

[21] Appl. No.: 09/166,133

[22] Filed: Sep. 30, 1998

[51] Int. Cl.[7] .................................................. G05F 1/575
[52] U.S. Cl. ...................................... 323/273; 323/280
[58] Field of Search .................................. 323/273, 275, 323/276, 280, 281, 312–316; 330/254, 260, 296, 298

[56] References Cited

U.S. PATENT DOCUMENTS

| | | | |
|---|---|---|---|
| 4,099,139 | 7/1978 | Oguri | 330/298 |
| 4,188,567 | 2/1980 | Monroe | 315/396 |
| 5,103,157 | 4/1992 | Wright | 323/275 |
| 5,153,500 | 10/1992 | Yamamoto et al. | 323/314 |
| 5,218,318 | 6/1993 | Ikuzawa | 330/254 |
| 5,664,575 | 9/1997 | Banjanin et al. | 128/661.09 |
| 5,686,821 | 11/1997 | Brokaw | 323/273 |
| 5,739,596 | 4/1998 | Takizawa et al. | 307/66 |

*Primary Examiner*—Adolf Danake Berhane

[57] ABSTRACT

An amplifier (32) is provided which allows for reduced system power dissipation. The amplifier (32) can dynamically draw power from different supply voltages in response to an input voltage signal. The amplifier (32) includes a plurality of complementary transistor pairs (40–46), where each transistor pair is coupled to a respective power supply. Each transistor pair provides output current when the input voltage signal is within a respective predetermined voltage range. This arrangement permits the amplifier (30) to interpolate between the supply voltages to generate a continuous amp output. System power is conserved by selecting the power supply which can most efficiently supply the required current within the voltage range.

20 Claims, 7 Drawing Sheets

AMPLIFIER FOR INTERPOLATING THE POWER SUPPLY FROM MULTIPLE SUPPLY VOLTAGES

BACKGROUND OF THE INVENTION

1. Technical Field of the Invention

The present invention relates generally to electronic amplifiers, and in particular, to a reduced power consumption amplifier that can provide power from multiple voltage sources.

2. DESCRIPTION OF THE RELATED ART

Various types of electronic amplifiers are known. FIG. 1 shows an example of a conventional Class AB amplifier 5. Class AB amplifiers use an arrangement of pnp and npn transistors Q1, Q2 known as complementary pair 6. The pair can be biased by voltage generators 7–8. In response to an input voltage, the Class AB amplifier 5 produces an output voltage $V_{OUT}$ that follows the input voltage.

Although Class AB amplifiers provide an efficient means for transferring power to loads, a simple Class AB amplifier can provide power from only one voltage supply. In many applications, this causes inefficiency because voltage supplies are optimized to perform over specified ranges. Consequently, it is known to be more efficient to supply power from multiple sources. For example, in the field of ultrasound imaging, it is generally more efficient to deliver transmit power to an ultrasound imager from several voltage sources, where each source optimally performs over a predetermined voltage range.

FIG. 2 illustrates a prior art transmit voltage selector circuit 11 for accomplishing power supply selection in a ultrasound imaging system 10. The transmit selector 11 includes a microcontroller 12 and a plurality of software controlled switches 14a–d, which are coupled to a plurality of voltage supplies 16a–d. The voltage selector 11 supplies power to an ultrasound imager 18 by discretely selecting the supplies best suited for the load requirements. Based on the power requirements of the imager 18, the microcontroller 12 selects the one voltage supply from the group 16a–d that can supply the load voltage most efficiently. One drawback of this arrangement is that the supply voltage must pass through a software-controlled switch, which results in a discontinuous, switched output that can cause noise in the imager 18. Another problem is that the frequency response of the software-based selector 11 may not be fast enough to keep up with changes in the power requirements of the imager 18. The selector 11 is also relatively complex and costly. For instance, to select the appropriate supply, the microcontroller 12 must be programmed according to the amplifier transfer function of the ultrasound imager 18. This increases the complexity of the software in the microcontroller 12. Moreover, the microcontroller 12 requires control inputs for the selection function. These inputs must be supplied by external logic and circuitry, which additionally increases the cost and complexity of the system.

Thus, there is a need for a device that simplifies and improves the delivery of transmit power in an ultrasound imager.

SUMMARY OF THE INVENTION

It is an advantage of the present invention to provide an improvement for delivering power from multiple voltage supplies in an electronic system. According to one aspect of the present invention, an amplifier having an improved power output stage can dynamically draw power from different supply voltages depending upon the output voltage requirements. The amplifier includes a plurality of complementary transistor pairs. Each transistor pair provides current to an output load from a respective power supply in response to an input signal occurring within a respective voltage range. Accordingly, the amplifier can automatically interpolate between supply voltages to produce the required load current. During conditions when the amplifier input and output are near zero volts, the amplifier draws quiescent load current from the lowest supply to reduce power consumption. Because the amplifier requires significantly fewer components, it substantially reduces cost complexity, and power dissipation.

BRIEF DESCRIPTION OF THE DRAWING

Other features, objects and advantages of the present invention will become readily apparent and understood upon consideration of the following detailed description and attached drawings, wherein.

DETAILED DESCRIPTION OF THE INVENTION

Figure 1:
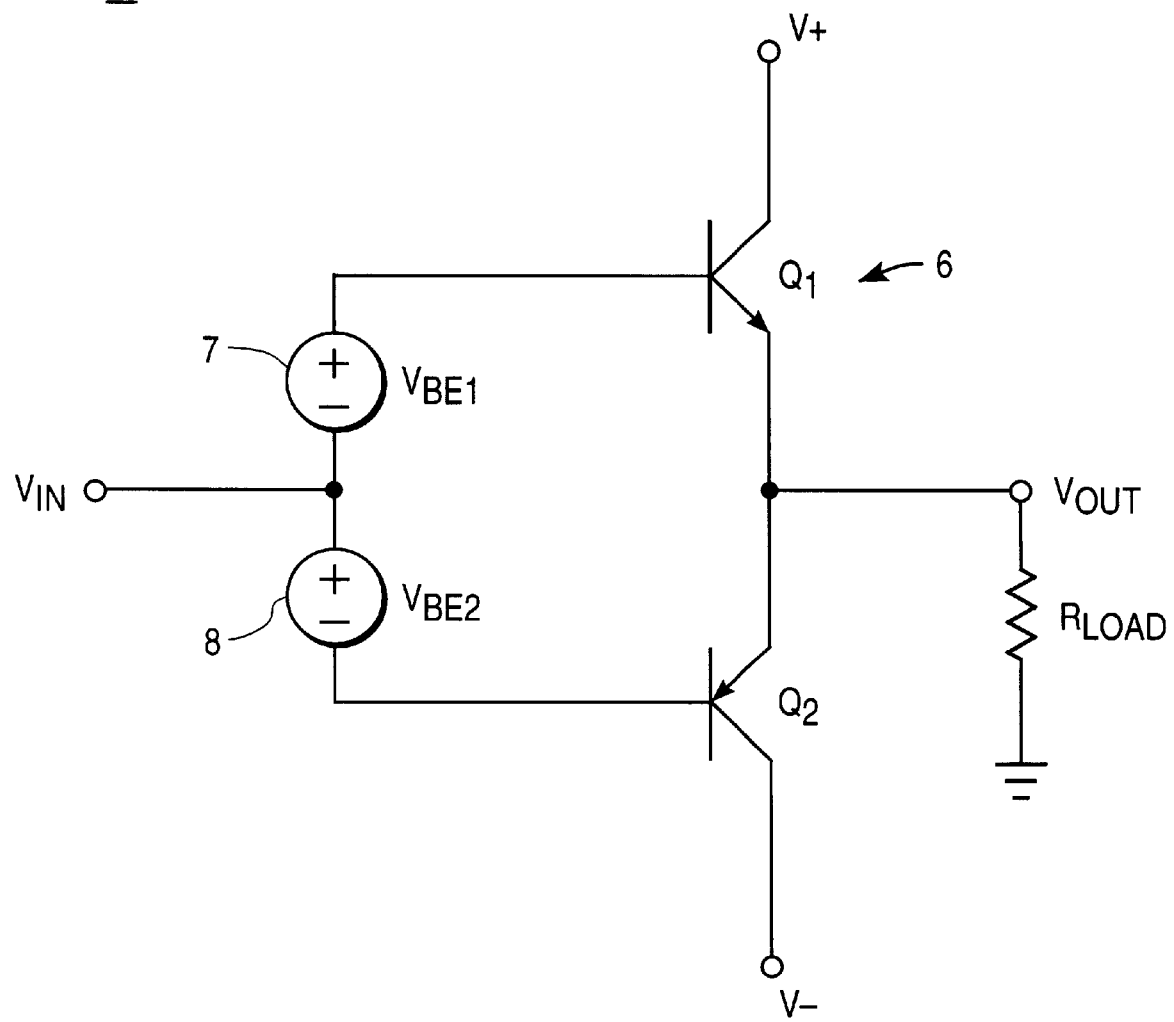
FIG. 1 is a circuit diagram of a prior art Class B amplifier.
Figure 2:
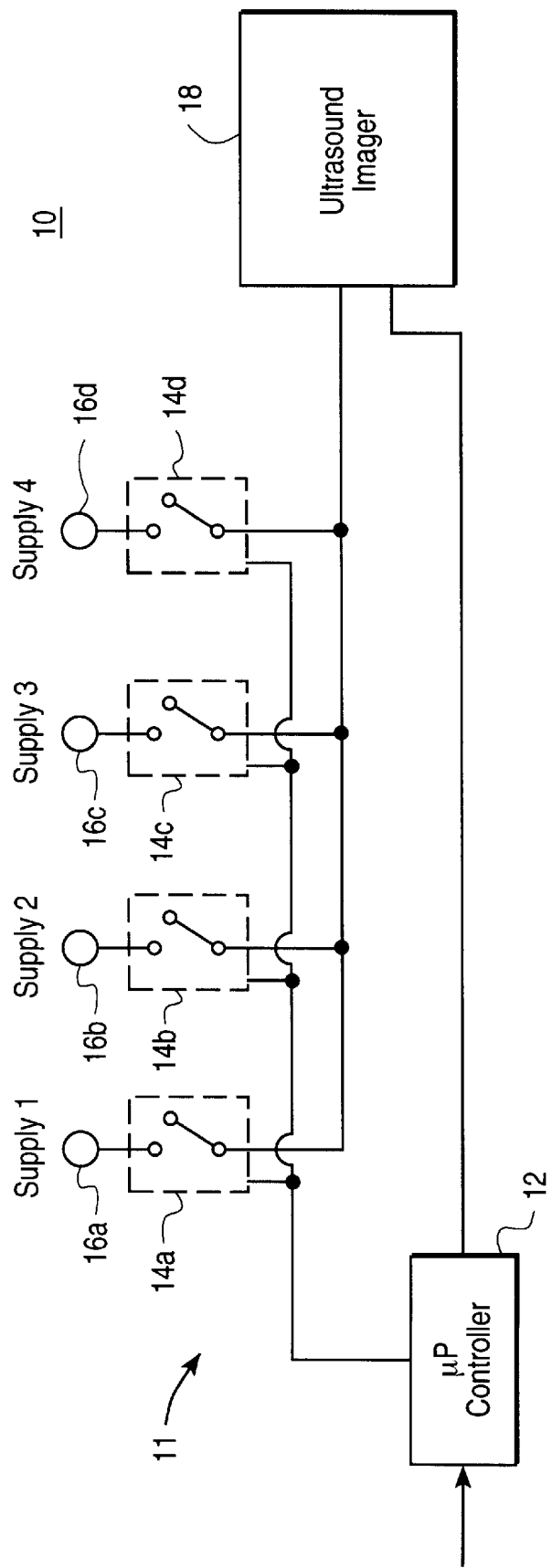
FIG. 2 is a block diagram illustrating a prior art transmit power regulator in a medical ultrasound imaging system.
Figure 3:
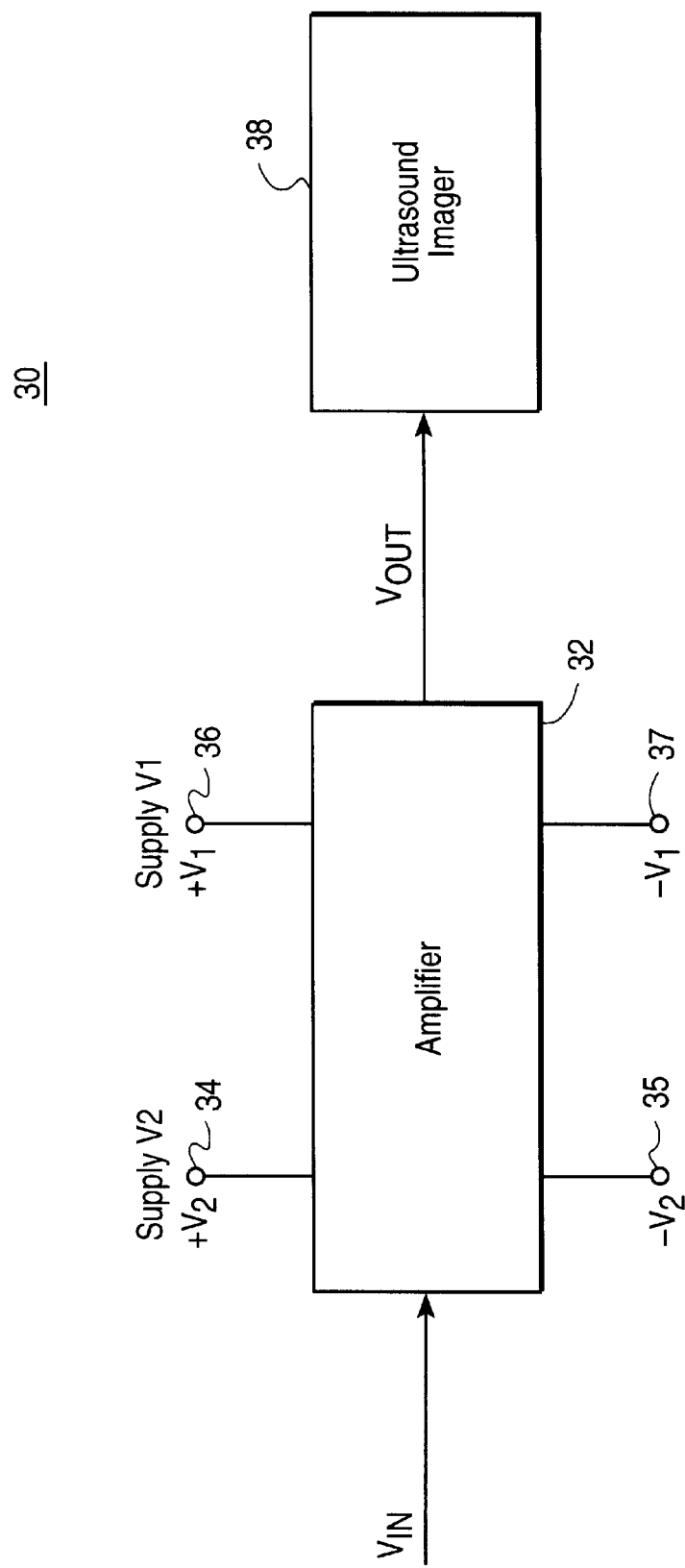
FIG. 3 is a block diagram illustrating an ultrasound imaging system in accordance with an embodiment of the present invention.

Turning now to the drawings, and in particular to FIG. 3, there is illustrated an exemplary system incorporating an interpolating amplifier 32 in accordance with one embodiment of the present invention. Specifically, FIG. 3 depicts an ultrasound imaging system 30 that includes the amplifier 32. The ultrasound imaging system 30 can be used in a variety of applications, including but not limited to medical imaging. The ultrasound application of the interpolating amplifier 32 is provided as an example. The amplifier 32 can also be used for other applications; as a voltage buffer, low-frequency regulator or wideband power amplifier in a variety of other electronic systems.

The ultrasound imaging system 30 includes the amplifier 32, a first power supply V1, a second power supply V2, and an ultrasound imager 38. The amplifier 32 receives a plurality of supply voltages V1, V2 and an input voltage $V_{IN}$. In response to the input voltage, the amplifier 32 can interpolate the supply voltages to produce a non-switched output $V_{OUT}$, which can be used for transmit power in the ultrasound imager 38. As will be addressed in more detail below, output load current for the ultrasound imager 38 is drawn from the particular supply with a range which encompasses the input voltage. In this embodiment, the amplifier 32 behaves as a low-frequency regulator, where the input voltage acts as a reference voltage, which is tracked by the amplifier 32 to produce an equivalent output voltage by drawing current from the different supplies as $V_{IN}$ transitions between ranges. Although only two power supplies V1, V2 are shown in the system 30, it will be apparent to one of ordinary skill in the art that more than two supplies can be interpolated by the amplifier 32 by including additional output transistor stages.

The first power supply V1 includes a first set of positive and negative voltage terminals 36–37; while the second supply voltage supply V2 includes a second set of positive and negative supply terminals 34–35. Different voltages can be provided by each supply. For instance, supply V1 can generate ±3 volts at terminals 36–37, respectively; and supply V2 can generate ±10 volts at terminals 34–35.

The ultrasound imager 38 can be a conventional imager used in medical diagnostic applications for displaying and analyzing anatomical structures within a patient's body, such as disclosed in commonly owned U.S. Pat. No. 5,664,575, titled "Ultrasound Doppler Imager Having an Adaptive Tissue Rejection Filter With Variable Parameters", hereby incorporated by reference. Such an imager transmits sound waves of very high frequency, typically 2 to 10 MHZ, into the patient's body and processes echoes reflected from tissues and materials within the patient's body. Generally, the imager 38 includes a probe (not shown) for transmitting and receiving the sound waves. Also included in the imager 38 is circuitry associated with the probe for converting electrical signals to the sound waves. The transmit power generated by the amplifier is used by this circuitry to produce the sound waves.

Figure 4:
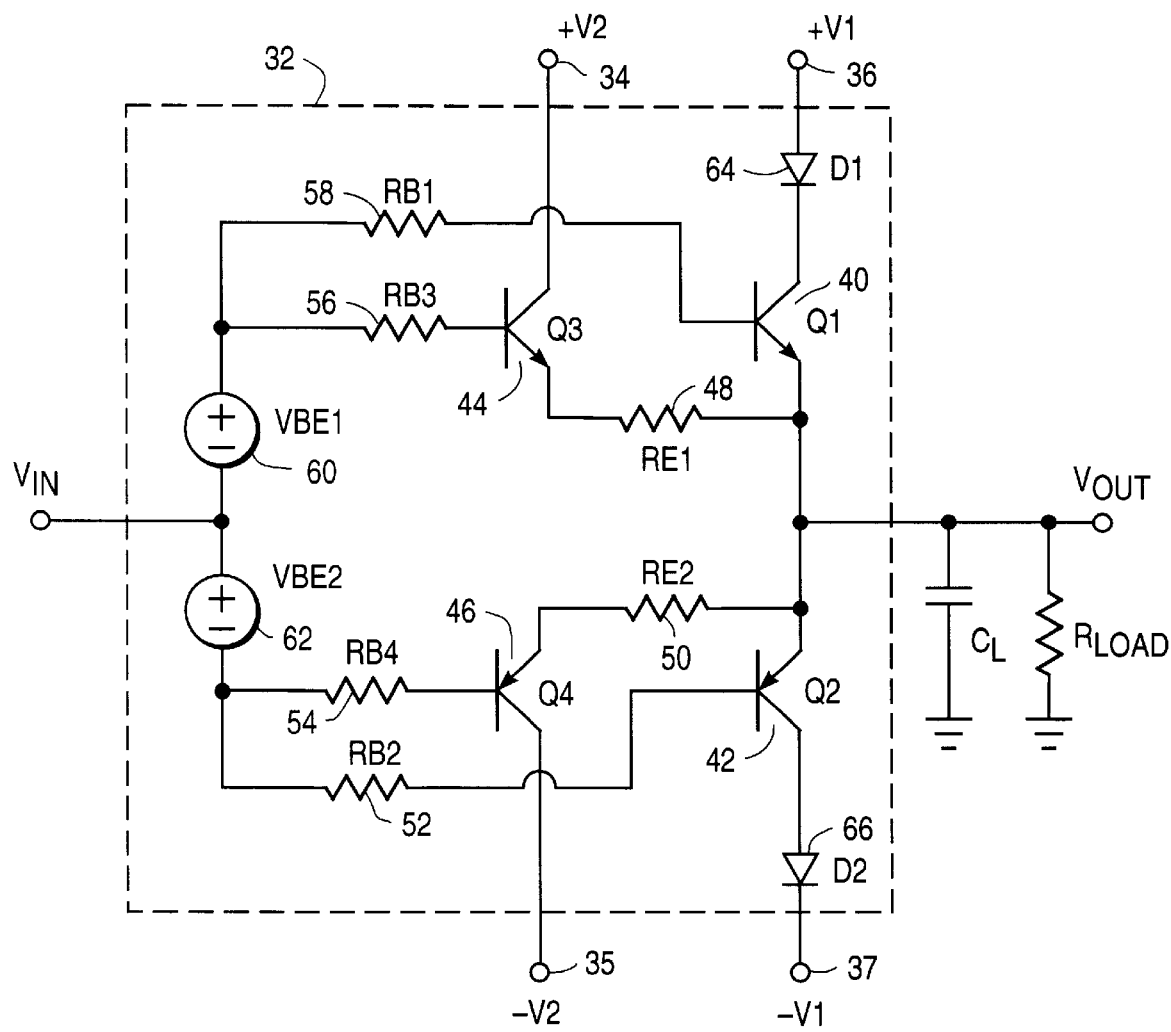
FIG. 4 is a detailed circuit diagram of the amplifier shown in FIG. 3 in accordance with an embodiment of the present invention.

FIG. 4 illustrates a circuit diagram for the amplifier 32 in accordance with an embodiment of the present invention. The circuit works by using multiple output transistors configured as complementary pairs each connected to a unique power supply. Although only two supplies V1, V2 are shown, the number of interpolation stages (complementary pairs) can be increased to accommodate any number of supplies. This arrangement of the transistors causes the load current to be supplied by the output transistor connected to the lowest voltage source, while $V_{IN}$ remains within the voltage range of that source. When $V_{IN}$ exceeds the range of the lowest source, output current is then drawn from the next lowest voltage source.

The amplifier 32 includes a relatively small number of components, and thus, dramatically reduces the cost of supplying transmit power in ultrasound imaging systems. Specifically, the amplifier 32 includes a first npn transistor 40 and a first pnp transistor 42 arranged as a first complementary pair. The amplifier 32 also includes a second npn transistor 44 and a second pnp transistor 46, arranged as a second complementary pair. A pair of emitter degeneration resistors 48–50 are coupled to second npn and pnp transistors 44–46. The emitter resistors 48–50 can each have values of 1 ohm. The circuit includes a plurality of base resistors 52–58 connecting the base terminals of the transistors 40–46 to the input voltage signal. The base resistors 52–58 can each have a value of 100 ohms. A first diode 64 is connected between the positive supply 36 and the collector of the first npn transistor 40; while a second diode 66 is connected between the collector of the first pnp transistor 42 and the negative terminal 37 of the first voltage supply V1. In amplifiers having more than two transistor stages, diodes such as those shown in FIG. 4 are included in all transistor stages except the one having the highest supply voltage.

A pair of voltage generators 60–62 are included to bias the transistors 40–46 to reduce cross-over distortion. The voltage generators can be adjusted to any appropriate valve, including 0.5 volts each. One or more conventional biasing resistor networks (not shown) connected to the voltage supplies can be used as voltage generators to provide bias voltages to each of the transistors 40–46. Alternatively, diodes or diode-connected transistors can be used as voltage generators. A diode-connected transistor is a transistor with its base and collector connected together. A diode-connected transistor has advantages because it can be easily manufactured on the same integrated circuit (IC) substrate with the other transistors in the circuit 32. In such an embodiment, the transistors will have common characteristics, such as temperature sensitivity.

A Darlington pair can be equivalently substituted for each of the transistors 40–46. Darlington pairs can increase the gain of each equivalent transistor 40–46. For example, a beta β value of 800 can be achieved for each Darlington pair. In addition, the transistors 40–46 can be bipolar junction transistors (BJTs), hetero-bipolar junction transistors (H-BJTs) or field effect transistors (FET).

Operation of the amplifier 32 is described by the following example. In the circuit shown, transistors 40–42 form the low voltage interpolation stage and transistors 44–46 form the high voltage interpolation stage. When the input signal $V_{IN}$ is within the range $\pm V1$, the output current is supplied to the exemplary load $R_{LOAD}$ and $C_L$ primarily by the supply V1 through transistors 40–42. This is caused by the emitter resistors 48–50, which decrease the base-emitter voltages across transistors 44–46 with respect to transistors 40–42. When $V_{IN}$ exceeds the range $\pm V1$, transistors 40–42 go into cut-off, and all of the load current is supplied by the high voltage stage, transistors 44–46.

For instance, when $V_{IN}$ goes to a positive voltage exceeding $\pm V1$, the base-collector junction of transistor 40 is forward biased, causing the transistor 40 to turn off. In addition, the base-emitter junction of the transistor 42 is reverse biased, causing the transistor 42 to also be in an off state. Consequently, very little current is drawn from the V1 supply.

Conversely, when $V_{IN}$ goes to a negative voltage less than $-V1$, the base-collector junction of transistor 42 is forward biased, causing transistor 42 to cut off. The base-emitter junction of transistor 40 is likewise reverse biased causing transistor 40 to be shut off. Similar to the above example when $V_{IN} > +V1$, minimal current is drawn from the supply V1 when $V_{IN} < -V1$.

In a quiescent state ($V_{IN} = 0$ V) however, quiescent load current is primarily supplied by the low voltage stage (V1). The voltage generators 60–62 can be used to bias the transistors 40–46 above cut-off when $V_{IN} = 0$ volts. However, the emitter resistors 48–50 decrease the base-emitter voltages of the high voltage stage transistors 44–46, causing their share of the load current to be minimal. Consequently, quiescent load current is primarily supplied by the low voltage stage. Drawing quiescent load current from the lower voltage stage rather than the high voltage stage significantly reduces power consumption.

Figure 5A:
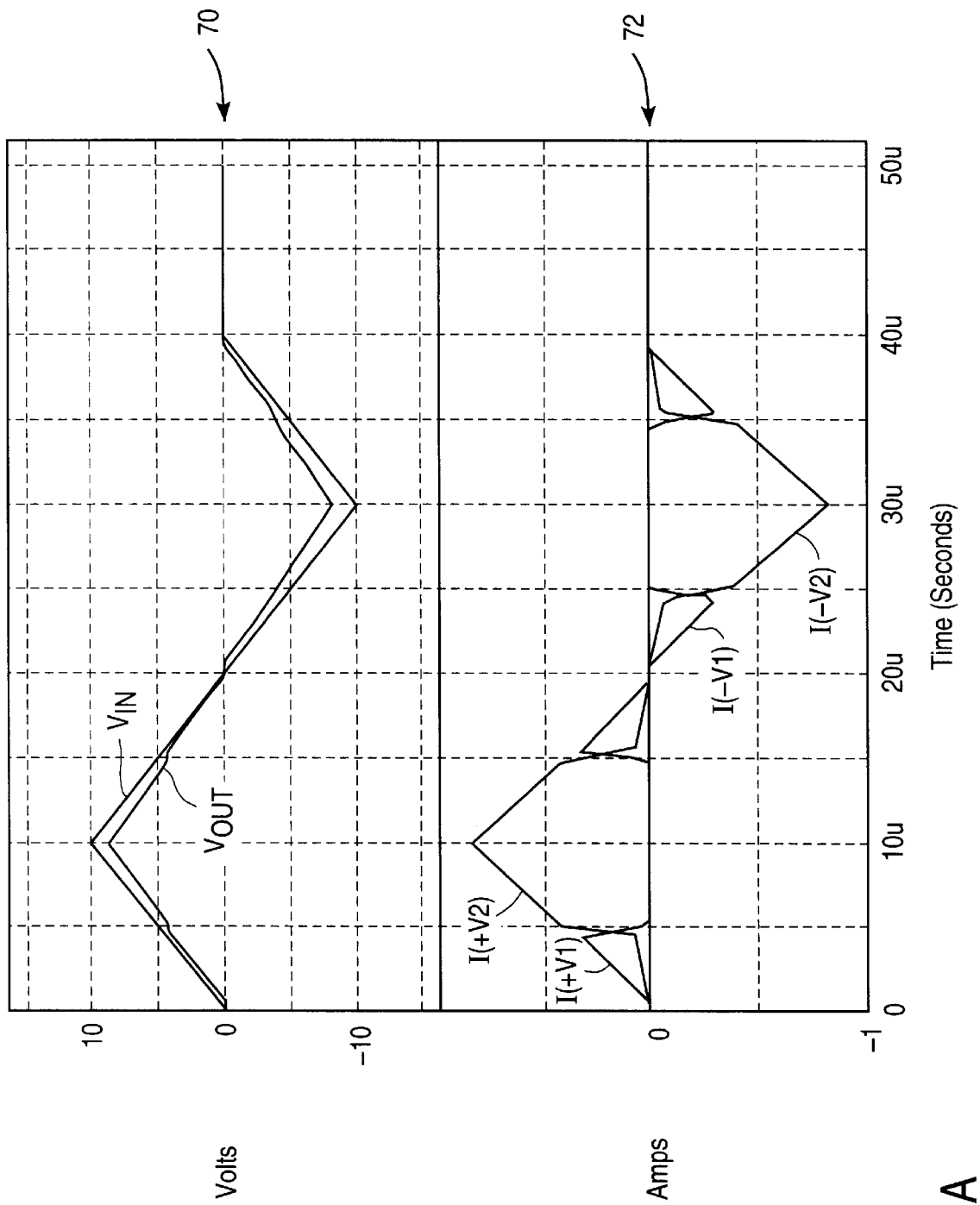
FIGS. 5a–b are graphs showing responses of the amplifier shown in FIG. 4.

FIG. 5a shows graphs 70, 72 illustrating the response of the amplifier 32 to a saw tooth voltage input, where the amplifier 32 has a purely resistive load $R_{LOAD}$. Graph 70 shows an input saw tooth voltage waveform varying between ±10 volts at a frequency of 25 KHz, and the output voltage $V_{OUT}$ generated in response by the amplifier 32.

The graph 72 shows the output current supplied by each of the interpolation stages of the amplifier 32. In the input voltage range of approximately ±4 volts, most of the output current l(±V1) is supplied from the low voltage stage, transistors 40–42. Outside of this input voltage range, the output current l(±V2) is supplied by the high voltage stage, transistors 44–46.

Figure 5B:
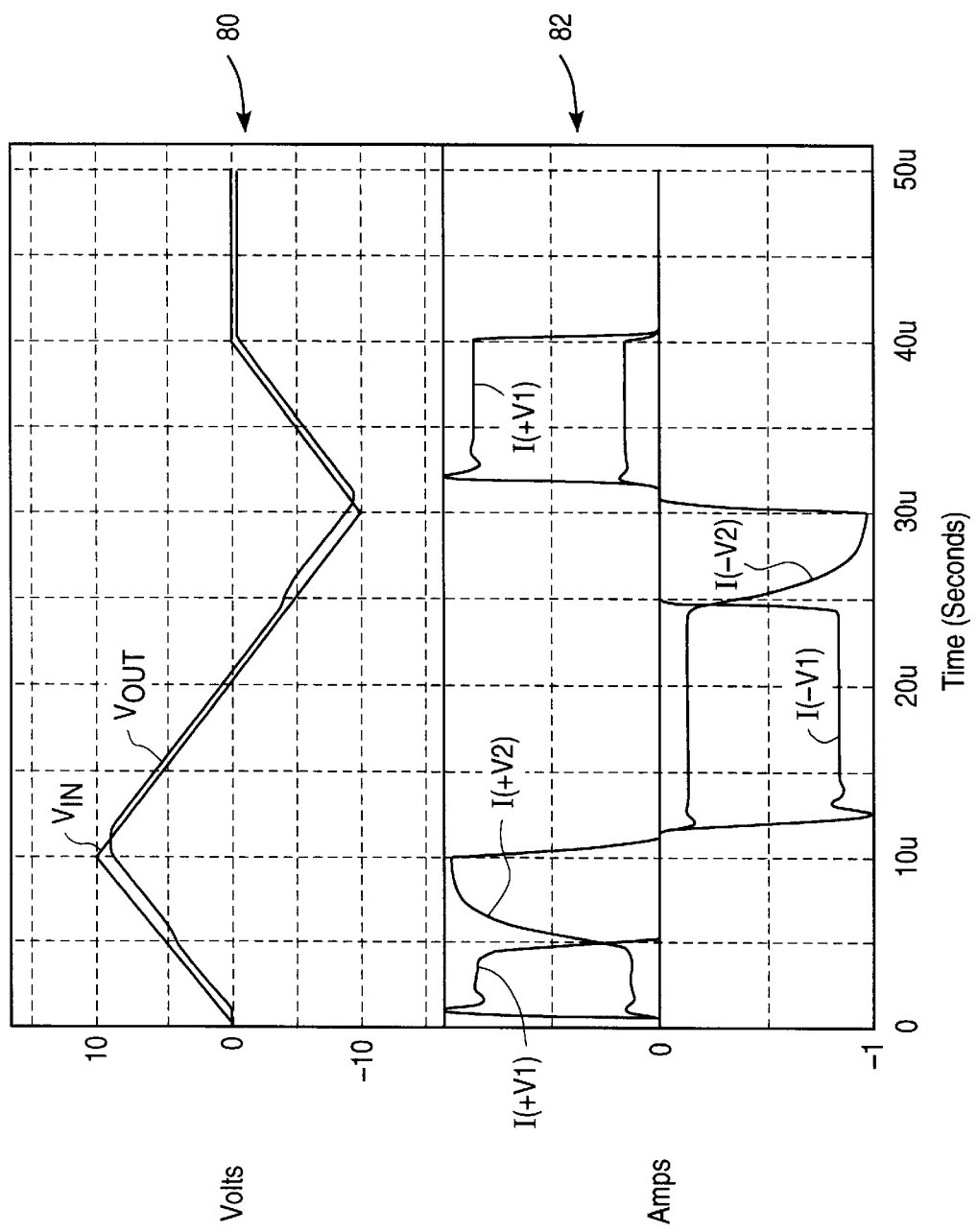

FIG. 5b shows graphs 80, 82 illustrating the response of the amplifier 32 for a capacitive load $C_L$. The graph 80 shows the voltage transfer characteristic of the amplifier 32 for an input saw tooth voltage having the same characteristics shown in graph 70 of FIG. 5a. The graph 82 illustrates the current supplied to the capacitive load by each of the interpolation stages of the amplifier 32. The graphs 70–82 illustrate the important characteristic of the amplifier 32, namely that the output current is smoothly interpolated from one supply to the next as the input voltage varies.

Figure 6:
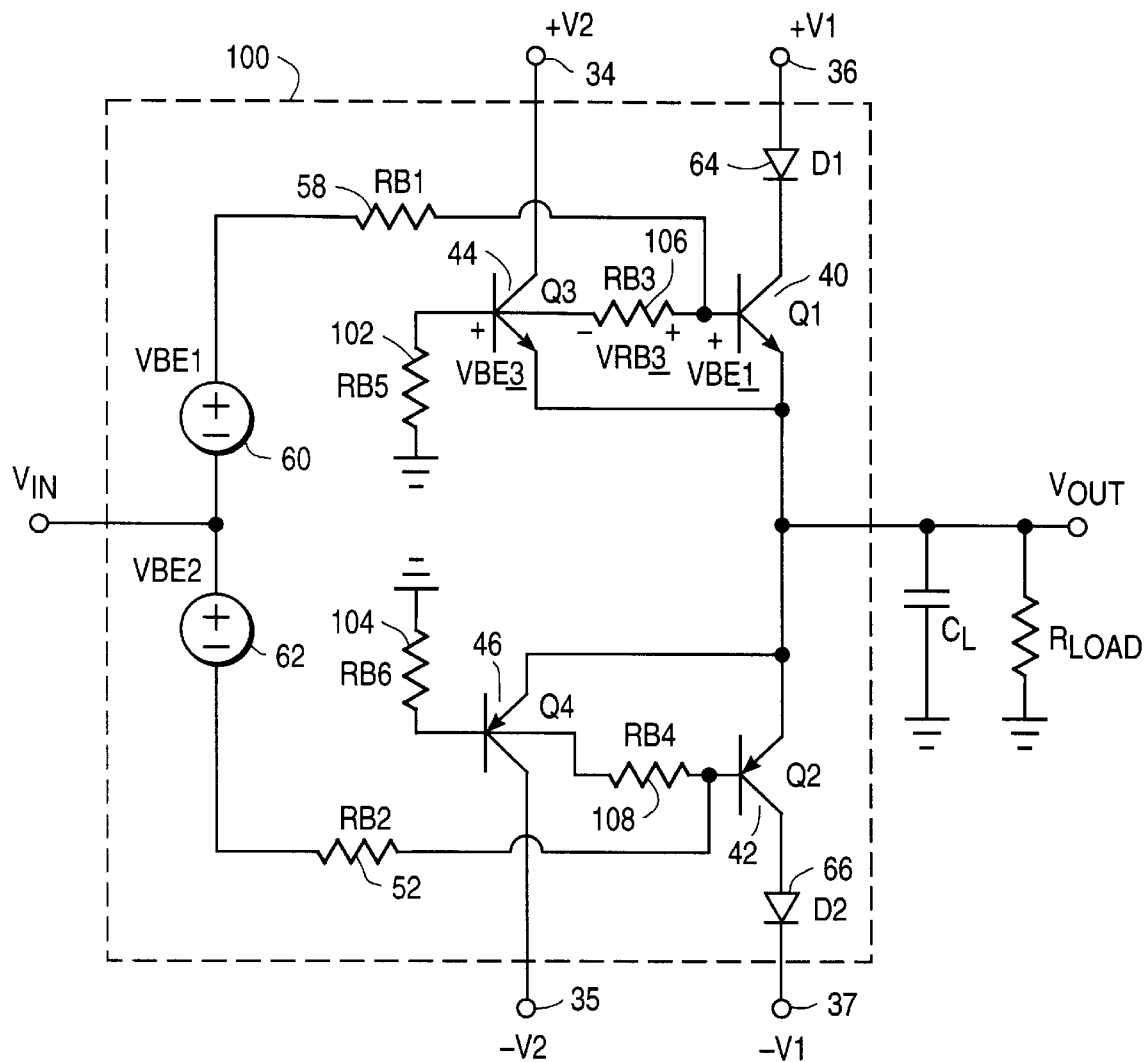
FIG. 6 is a detailed circuit diagram of the amplifier shown in FIG. 3 in accordance with another embodiment of the present invention.

FIG. 6 is a diagram of an alternative circuit 100 in accordance with another embodiment of the invention. In the alternative circuit 100, the emitter resistors $R_{E1}$ and $R_{E2}$ 48–50 have been omitted and base resistors $R_{B3}$–$R_{B6}$ 102–108 have been added. The resistance values of base resistors $R_{B3}$–$R_{B6}$ 102–108 can be selected to cause a reduction in the base emitter voltage $V_{BE}$ across Q1–Q2 40–42.

If the transistors Q1–Q4 40–46 are bipolar, resistors $R_{B5}$ and $R_{B6}$ 102–104 may be omitted. This is because bipolar transistors have non-zero base currents, and consequently, a current path to ground is not necessary. If transistors Q1–Q4 are FET, $R_{B5}$ and $R_{B6}$ are necessary to produce a current path and hence a voltage drop across $R_{B3}$ and $R_{B4}$ 106–108.

In addition, the circuit 100 can be modified to include the emitter resistors $R_{E1}$ and $R_{E2}$ 48–50 of FIG. 4 in combination with the base resistors $R_{B3}$–$R_{B6}$ 102–108.

What is claimed is:

1. An amplifier, comprising:
    a voltage amplifier stage including means for receiving a plurality of supply voltages, wherein each supply voltage comprises a positive and a negative voltage;
    means for receiving an input voltage; and
    means for interpolating the supply voltages based on the input voltage to produce an output voltage.

2. The amplifier of claim 1, further comprising means for providing the output voltage to an ultrasound imager.

3. A system, comprising:
    an analog amplifier including a voltage amplifier stage receiving a plurality of supply voltages, whereby each supply voltage comprises a positive and a negative voltage, for interpolating between said plurality of supply voltages to produce an output voltage; and
    an ultrasound imager receiving the output voltage.

4. The system of claim 3, wherein the amplifier includes:
    a plurality of complementary transistor pairs;
    means for providing an electrical path between the emitters of each transistor pair and an output load; and
    means for distributing an input signal to the bases of each transistor pair;
    wherein each transistor pair provides output current to the output load in response the input signal occurring within a respective predetermined voltage range.

5. The system of claim 4, further comprising:
    means for coupling the collectors of each of the transistor pairs to a respective predetermined power supply.

6. The system of claim 4, further comprising:
    means for providing an emitter degeneration resistance to at least one of the transistor pairs.

7. The system of claim 4, further comprising:
    means for biasing the transistor pairs.

8. An amplifier, comprising:
    a first npn transistor having a collector in communication with a first power supply and an emitter coupled to an output node;
    a first pnp transistor having an emitter coupled to the output node and a collector in communication with the first power supply;
    a second npn transistor having a collector in communication with a second power supply;
    a second pnp transistor having a collector coupled to the second power supply;
    a first emitter resistor connected between the output node and the emitter of the second npn transistor;
    a second emitter resistor connected between the output node and the emitter of the second pnp transistor; and
    means for providing an input signal to the bases of the first and second npn transistors and the first and second pnp transistors.

9. The amplifier of claim 8, wherein the providing means includes:
    a first base resistor connected between an input node and the base of the first npn transistor;
    a second base resistor connected between the input node and the base of the first pnp transistor;
    a third base resistor connected between the input node and the base of the second npn transistor; and
    a fourth base resistor connected between an input node and the base of the second pnp transistor.

10. The amplifier of claim 9, wherein the base resistors have approximately the same values of resistance.

11. The amplifier of claim 8, further comprising:
    a diode connecting the first power supply to the collector of the first npn transistor.

12. The amplifier of claim 11, wherein the p-terminal of the diode is connected to the first power supply.

13. The amplifier of claim 8 further comprising:
    a diode connecting the first power supply to the collector of the first pnp transistor.

14. The amplifier of claim 13, wherein the n-terminal of the diode is connected to the first power supply.

15. The amplifier of claim 8, wherein the first and second emitter resistors have approximately the same values of resistance.

16. The amplifier of claim 8, further comprising:
    means for biasing the first and second npn transistors.

17. The amplifier of claim 8, further comprising:
    means for biasing the first and second pnp transistors.

18. An amplifier, comprising:
    a first npn transistor having a collector in communication with a first power supply and an emitter coupled to an output node;
    a first pnp transistor having an emitter coupled to the output node and a collector in communication with the first power supply;
    a second npn transistor having a collector in communication with a second power supply and an emitter in communication with the output node;
    a second pnp transistor having a collector coupled to the second power supply and an emitter in communication with the output node;
    a first base resistor coupling the bases of the first npn transistor and second npn transistor;
    a second base resistor coupling the bases of the first pnp transistor and the second pnp transistor; and means for providing an input signal to the bases of the first npn transistor and the first pnp transistor.

19. The amplifier of claim 18, further comprising:

a first emitter resistor connected between the output node and the emitter of the second npn transistor; and a second emitter resistor connected between the output node and the emitter of the second pnp transistor.

20. The amplifier of claim 18, further comprising:

a third base resistor coupled between the base of the second npn transistor and ground; and a fourth base resistor coupled between the base of the second pnp transistor and ground.

* * * * *